US006977840B2

(12) United States Patent
Fournel et al.

(10) Patent No.: US 6,977,840 B2
(45) Date of Patent: Dec. 20, 2005

(54) STORAGE ELEMENT WITH A DEFINED NUMBER OF WRITE CYCLES

(75) Inventors: Richard Fournel, Lubin (FR); Jean-Pierre Schoellkopf, Grenoble (FR); Philippe Candelier, St-Mury-Monteymond (FR)

(73) Assignee: STMicroelectronics S.A., Montrouge (FR)

( * ) Notice: Subject to any disclaimer, the term of this patent is extended or adjusted under 35 U.S.C. 154(b) by 83 days.

(21) Appl. No.: 10/453,466

(22) Filed: Jun. 3, 2003

(65) Prior Publication Data

US 2004/0017702 A1    Jan. 29, 2004

(30) Foreign Application Priority Data

Jun. 4, 2002   (FR) .................................. 02 06863

(51) Int. Cl.$^7$ ............................................. G11C 11/34
(52) U.S. Cl. .................................. 365/177; 365/185.11
(58) Field of Search ............................ 365/177, 185.11

(56) References Cited

U.S. PATENT DOCUMENTS

| | | | | |
|---|---|---|---|---|
| 4,310,879 A | * | 1/1982 | Pandeya | ...................... 712/32 |
| 5,200,652 A | | 4/1993 | Lee | .............................. 326/47 |
| 5,265,048 A | * | 11/1993 | Kimura | ................. 365/189.01 |
| 6,002,638 A | | 12/1999 | John | .......................... 365/233 |

FOREIGN PATENT DOCUMENTS

| | | |
|---|---|---|
| EP | 0 438 050 | 7/1991 |
| JP | 63074188 | 4/1988 |

OTHER PUBLICATIONS

Brey, Barry B., "Microprocessor/Hardware Interfacing and Applications," 1984, Charles E. Merrill, Columbus, Ohio, US XP002237681, pp. 230-231.
Preliminary Search Report for French Appl. No. 0206863 dated Apr. 9, 2000, not present.

\* cited by examiner

Primary Examiner—M. Tran
(74) Attorney, Agent, or Firm—Lisa K. Jorgenson; Stephen Bongini; Fleit, Kain, Gibbons, Gutman, Bongini & Bianco P.L.

(57) ABSTRACT

A few times programmable (FTP) storage element is provided. The FTP storage element includes a set of N elementary memory units and multiple selection circuits. Each of the elementary memory units includes an address bus for connection to a main address bus and a data bus for connection to a main data bus. The selection circuits generate successive selection signals for successively selecting one of the elementary memory units in order to give exclusive access to the one selected elementary memory unit. The selection circuits operate so as to automatically select a next one of the elementary memory units upon detection of a predetermined condition. In preferred embodiments, each of the elementary memory units is programmable.

22 Claims, 5 Drawing Sheets

STORAGE ELEMENT WITH A DEFINED NUMBER OF WRITE CYCLES

CROSS-REFERENCE TO RELATED APPLICATIONS

This application is based upon and claims priority from prior French Patent Application No. 02-06863, filed Jun. 4, 2002, the entire disclosure of which is herein incorporated by reference.

BACKGROUND OF THE INVENTION

1. Field of the Invention

The present invention relates to memory circuits, and more particularly to a storage element permitting a defined number of write cycles.

2. Description of Related Art

Conventional OTP type (One-Time-Programmable) storage elements allow a single memory write operation. Such circuits can be realized by EPROM (Electrically Programmable Read Only Memory) memories.

In some applications, it would be desirable to use FTP (Few Times Programmable) storage elements (i.e., storage elements allowing a successive and defined number of erasure and rewrite cycles). Conventionally, such FTP storage elements are realized with EEPROM (Electrically Erasable Programmable Read Only Memory) memories or FLASH memories, which are unfortunately expensive because of their complex dual polysilicon technology. For this reason, use of such memories is traditionally reserved for very specific applications.

However, in many applications, even applications that do not justify the high implementation cost of EEPROM or FLASH technology, it would be desirable to benefit from FTP (Few Times Programmable) functionality.

SUMMARY OF THE INVENTION

In view of these drawbacks, it is an object of the present invention to overcome these drawbacks and to realize an FTP-type memory circuit that is particularly inexpensive and allows a defined number of erasure-write cycles.

Another object of the present invention is to provide a simple architecture for a memory circuit that allows a defined number of erasure-write cycles.

Yet another object of the present invention is to realize a FLASH-type memory from a fuse/non-fuse technology that presently does not allow such functionality.

One embodiment of the present invention provides a few times programmable storage element that includes a set of n memory units, with each memory unit including an address bus, a data bus, and a control bus connected to a main address bus, a main data bus, and a main control bus, respectively. Elementary memory units have fuse elements that allow irreversible recording of information. Each elementary memory unit is associated with a selection unit that automatically produces a selection signal to allow access to the selected memory circuit whenever a predetermined condition is met.

Preferably, the predetermined condition results from detection of the writing of a preset state bit contained in each memory unit, so that writing of this particular bit by the user leads to automatic selection of the next unit, thus allowing a new write cycle in the storage element.

Thus, from a very inexpensive fuse/non-fuse technology, it is quite simple to realize the equivalent of a memory that is again programmable, as many times as the number of elementary memory units available. Thus, functionality equivalent to that of a rather expensive Flash-type memory is obtained. For this purpose, the thin oxide capacity of the CMOS technology can advantageously be used to realize a memory structure that is reprogrammable n times.

Preferably, automatic selection of the various memory units is realized by a set of n selection circuits connected in a chain, with each rank i selection unit allowing the generation of the rank i circuit selection signal according to the following formula:

$$CS_i = (1 \text{ AND } S_1 \text{ AND } \ldots S_{i-1}) \text{ AND } (SN_i \text{ AND } SN_{(i+1)} \ldots \text{ AND } SN_n)$$

where i>2 and <n−1, with $S_i$ and $SN_i$ being two signals respectively transmitted to and received from rank i+1 selection unit.

In one exemplary embodiment, the chain is organized so that each rank i selection unit receives information $S_{i-1}$ from rank i−1 selection unit, and in turn generates information $S_i$ transmitted to rank i+1 selection unit according to the formula:

$$S_i = S_{i-1} \text{ AND } SB_i$$

The first selection circuit generates information $S_1 = SB_1$ transmitted to the second selection unit. Inversely, each rank i selection unit receives information $SN_i$ from rank i+1 selection unit and generates information $SN_{i-1}$ transmitted to rank i−1 selection unit according to the formula:

$$SN_{i-1} = SN_i \text{ And } SNB_i$$

with $SNB_i$ being the logical reciprocal of $SB_i$ and the last selection unit producing information $SN_{n-1} = SNB_n$ transmitted to the penultimate selection unit. Thus, automatic selection of the memory units is carried out, so as to enable reprogramming of the whole storage element until exhaustion of the last memory units.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
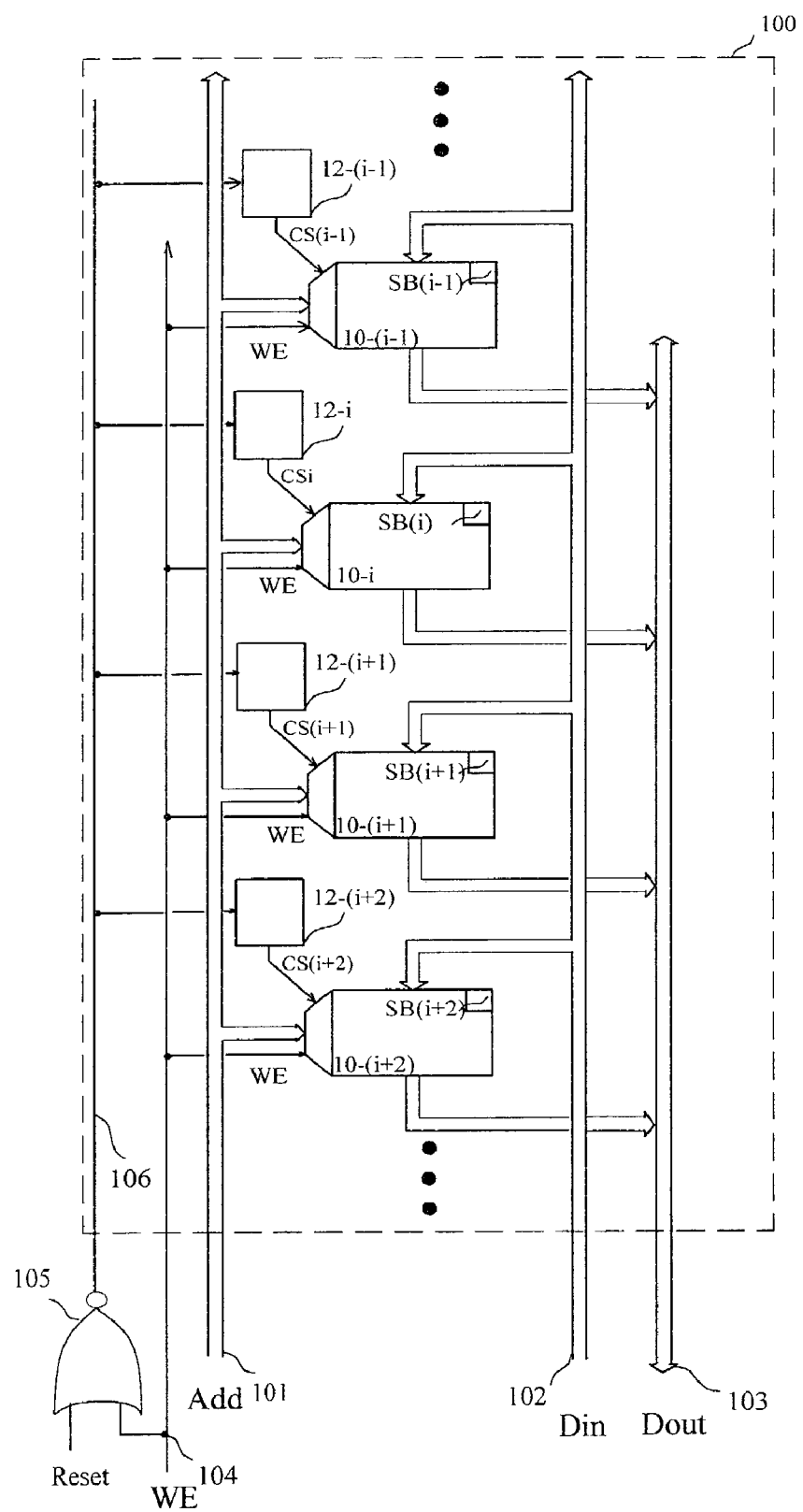
FIG. 1 illustrates a few times programmable storage element according to a preferred embodiment of the present invention.

FIG. 1 illustrates a few times programmable (FTP) storage element according to a preferred embodiment of the present invention. The FTP storage element 100 is composed of n memory units $10_1$ to $10_n$. For the purpose of clarity, in the figure four memory units $10_{i-1}$, $10_i$, $10_{i+1}$, and $10_{i+2}$, are shown. Each memory unit $10_1$–$10_n$ is formed by a memory of PROM or EPROM type for example, and has an address bus, an input data bus ($D_{IN}$), and an output data bus ($D_{OUT}$), with the latter preferably being a three-state-type bus in order to realize easy interconnection. These three buses are respectively connected to a main address bus 101, a main input data bus $D_{IN}$ 102, and a main output data bus $D_{OUT}$ 103. FTP storage element 100 also has control circuits. In particular, a Write Enable circuit (WE) 104 is distributed to every memory unit $10_1$ to $10_n$, and the units have a corresponding circuit selection input $CS_1$ to $CS_n$, (Chip-Select). Inputs $CS_1$ to $CS_N$ receive control signals that are generated by a set of n logical selection units $12_1$ to $12_n$, respectively. FIG. 1 shows logical selection units $12_{i-1}$, $12_i$, $12_{i+1}$, and $12_{i+2}$ generating signals $CS_{i-1}$, $CS_i$, $CS_{i+1}$, and $CS_{i+2}$ of memory units $10_{i-1}$, $10_i$, $10_{i+1}$, and $10_{i+2}$, respectively. Control of selection units $12_1$ to $12_n$ is carried out by a logical signal generated at the output of a NOR gate 105 and transmitted to each logical unit via a circuit 106. NOR gate 105 has a first input receiving a reset signal (RESET) and a second input receiving a write enable signal (WEN) on circuit 104.

For illustration purposes, it will be assumed that each memory unit $10_1$ to $10_n$ is 33-bits long, with the first 32 bits being used for storing a page of four 8-bit words, or of one 32-bit word. Clearly, the size of memory unit $10_i$ can be easily adapted as desired for a specific application.

Each memory unit $10_i$ includes an additional bit (i.e., a 33rd bit), which is added to the bits corresponding to the i page stored in the circuit. This additional bit (or status bit $SB_i$) is used by the selection unit associated with the corresponding memory unit, as is explained below.

Figure 2:
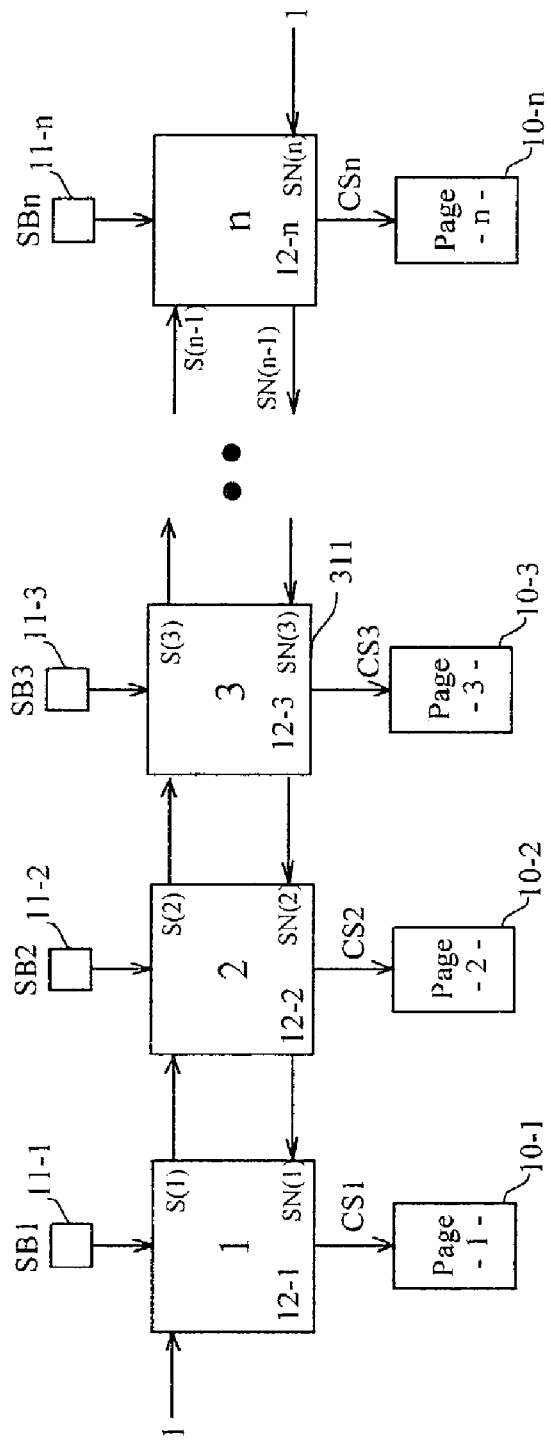
FIG. 2 more particularly illustrates an exemplary logical control portion for elementary PROM circuits.

With reference to FIG. 2, there will now be described a first embodiment of the logical chaining of memory units $10_i$ to allow the realization of a storage element that generally embodies an FTP-type functionality. For clarity's sake, only the first three memory units $10_1$, $10_2$, and $10_3$ and the last unit $10_n$ ending the chain are shown, along with their corresponding selection units $12_1$, $12_2$, $12_3$, and $12_n$, respectively.

In this first embodiment, except for selection units $12_1$ and $12_n$ that are placed at the ends of the chain, each unit $12_i$ receives the status bit information $SB_i$ state (11-$i$ in FIG. 2) of its corresponding i page, and information from the preceding unit in the chain and information from the following unit in this chain. Thus, two information chains are realized (i.e., a chain $S_i$ and a chain $SN_i$) which propagate in opposed directions.

In the left to right direction it can be observed that each rank i unit $12_i$ receives an information $S_{i-1}$ from its rank i−1 preceding unit $12_{i-1}$ located to its left (in FIG. 2), and in turn generates an information $S_i$ that is transmitted to the rank i+1 unit $12_{i+1}$ located on its right side. The relation between both information $S_{i-1}$ and $S_i$ is given by the following formula:

$$S_i = S_{i-1} \text{ AND } SB_i$$

First unit $12_i$ receives information that is a logical signal set to 1 so that unit $12_i$ generates information $S_1 = SB_1$ that is transmitted to its immediate neighbor, namely unit $12_2$.

In the other direction, information pieces $SN_i$ make up a chain that propagates from the last selection unit $12_n$ towards the first unit $12_1$. In the right-left direction, each rank i unit $12_i$ receives information $SN_i$ information from the rank i+1 unit $12_{i+1}$ immediately to its right, and in turn generates information $SN_{i-1}$ that it transmits to the rank i−1 unit $12_{i-1}$ located on its left. The relation between pieces of information $SN_i$ and $SN_{i-1}$ is given by the following formula:

$$SN_{i-1} = SN_i \text{ AND } SNB_i$$

where $SNB_i$ is the logical reciprocal of $SB_i$.

The last unit $12_n$ receives information $SN_n$ that is a logical signal set to 1 so that unit $12_n$ generates information $SN_{n-1} = SNB_n$.

Both chains $S_i$ and $SN_i$ are used within each logical selection unit $12i$ to automatically generate selection signals for corresponding memory units $10_i$ in a way that is completely transparent for the user, in order to realize the desired FTP function. More precisely, the control signal is calculated by the following formula:

$$S_i = (1 \text{ AND } S_1 \text{ AND } \ldots S_{i-1}) \text{ AND } (SN_i \text{ AND } SN_{(i+1)} \ldots \text{ AND } SN_n)$$

for i>2 and <n−1.

Figure 3:
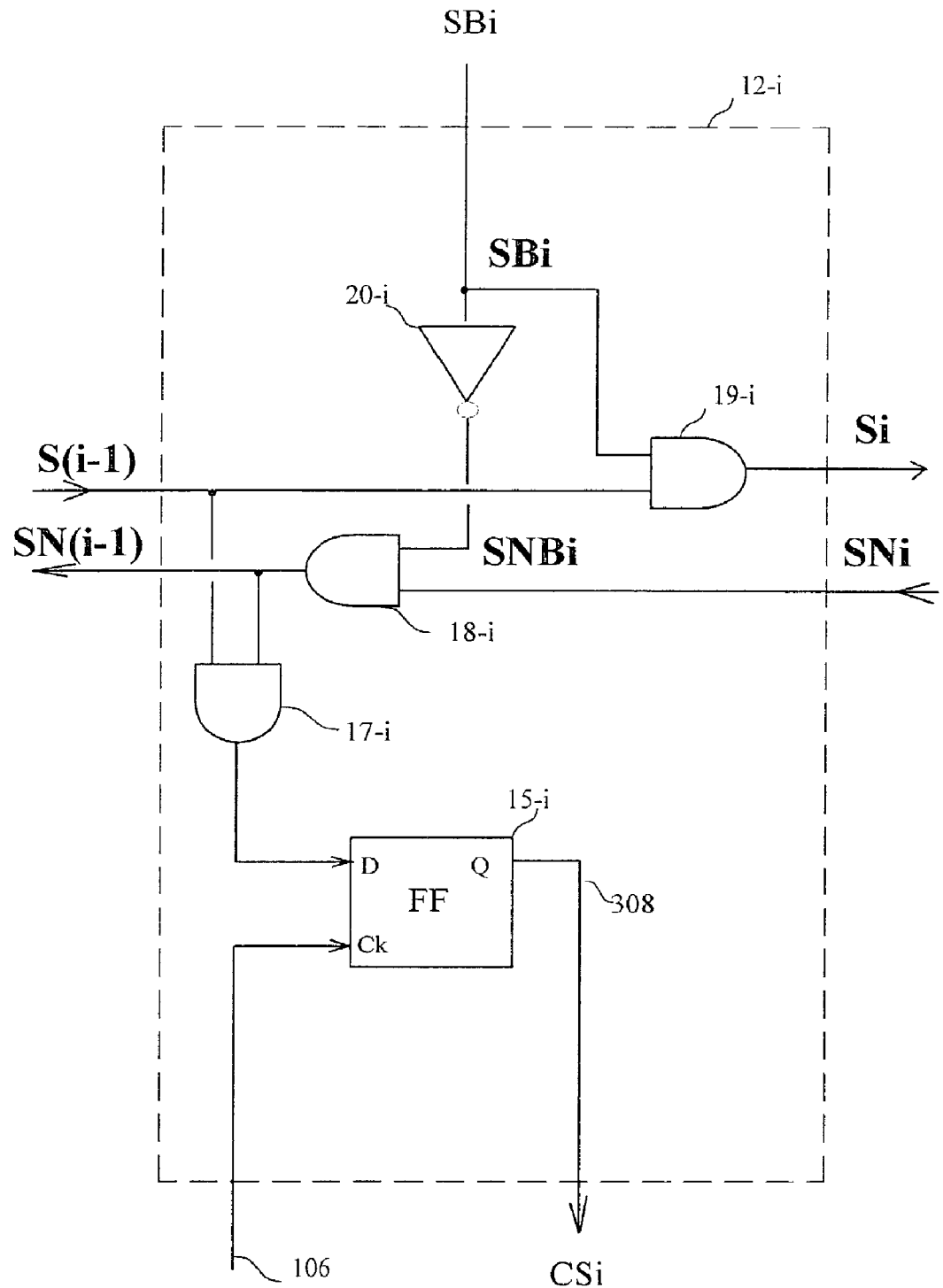
FIG. 3 illustrates a first embodiment of a selection unit.

FIG. 3 illustrates the physical realization of a rank i logical selection unit for association with each memory unit in the first embodiment. The selection unit $12_i$ includes a first logical AND gate $19_i$ having a first input receiving information $SB_i$ of the status bit corresponding to the rank i memory unit $10_i$. First AND gate $19_i$ has a second input receiving information $S_{i-1}$ generated and transmitted by the rank i−1 selection unit $12_{i-1}$, and an output generating information $S_i$ that is transmitted to the rank i+1 selection unit $12_{i+1}$. A second AND gate $18_i$ has a first input receiving the output of an inverter $20_i$ whose input receives information $SB_i$ of the status bit corresponding to the rank i memory unit $10_i$. Second AND gate $18_i$ has a second input receiving the information $SN_i$ transmitted by the rank i+1 logical selection unit $12_{i+1}$, and outputs information $SN_{i-1}$ that is transmitted to the rank i−1 selection unit $12_{i-1}$.

A third AND gate $17_i$ has a first input receiving the information $S_{i-1}$ generated and transmitted by the rank i−1 selection unit $12_{i-1}$, and a second input connected to the output of the second AND gate $18_i$. Third AND gate $17_i$ generates an output control signal that is transmitted to input D of a latch $15_i$ whose output Q generates a selection signal $CS_i$ for the corresponding memory unit. The clock input of the latch receives a programming signal for ensuring that, when a logical 1 is written to the status bit of the current memory circuit $10_i$, the memory circuit is disabled only at the end of a write cycle. More particularly, it is observed that the clock input receives the control signal generated by NOR gate 105 of FIG. 1 and transmitted via circuit 106. As a result, latch $15_i$ samples from the falling edge of both signals, and the RESET signal is used to charge the first latch upon start-up.

As can be seen, the double chain of $S_i$ and $SN_i$ allows the automatic generation of control signals $CS_1$ to $CS_n$ in order to enable automatic selection of the current active page corresponding to a selected memory unit $10_i$. To this end, storage element 100 is initialized with all status bits $SB_1$ to $SB_n$ set to 0. It is then observed that, after the falling edge of the RESET signal, unit 101 is selected upon powering of the circuit. Consequently, addresses transmitted by address bus 101 point to this particular memory unit, and memory accesses, read operations, and one write operation are carried out in this memory unit.

As soon as a logical 1 is being stored in the status bit $SB_1$ of the first memory unit $10_1$, a shift is caused in the chains of $S_i$ and $SN_i$. This causes, upon the end of this bit storing, memory circuit 101 to be deselected and, correlatively, the next memory unit to be automatically selected (i.e., second unit $10_2$). Thus, selection of the correct page is realized until exhaustion of all pages contained in memory 100, and this is accomplished in a completely automatic way and without the user having to select among the various memory units contained within storage element 100.

When the status bit $SB_n$ of the last memory unit $10_n$ is written, the possibilities of selection of the various memory units $10_1$ to $10_n$ are then exhausted as consequently are the possibilities for reprogramming storage element 100, which then stays fixed to the last page $10_n$. Then, it is only possible to read the last page and memory unit 100 behaves like a ROM.

It can thus be seen that the desired Few Times Programmable (FTP) function is realized in a particularly cost-effective and advantageous way, without resorting to expensive technologies, such as those used in Flash memory or EEPROM memory. One particular embodiment is an electronic board having several independent memory modules combined as described above. However, the present invention is by no means limited to such an embodiment and the description could easily be adapted to realize a storage unit having n elementary units that, rather than being perfectly individualized EPROM memories, could simply be elements of a single semiconductor circuit. Thus, a new memory circuit structure can be realized within a single integrated circuit, providing this circuit with FTP functionality with a number of possible applications.

Figure 4:
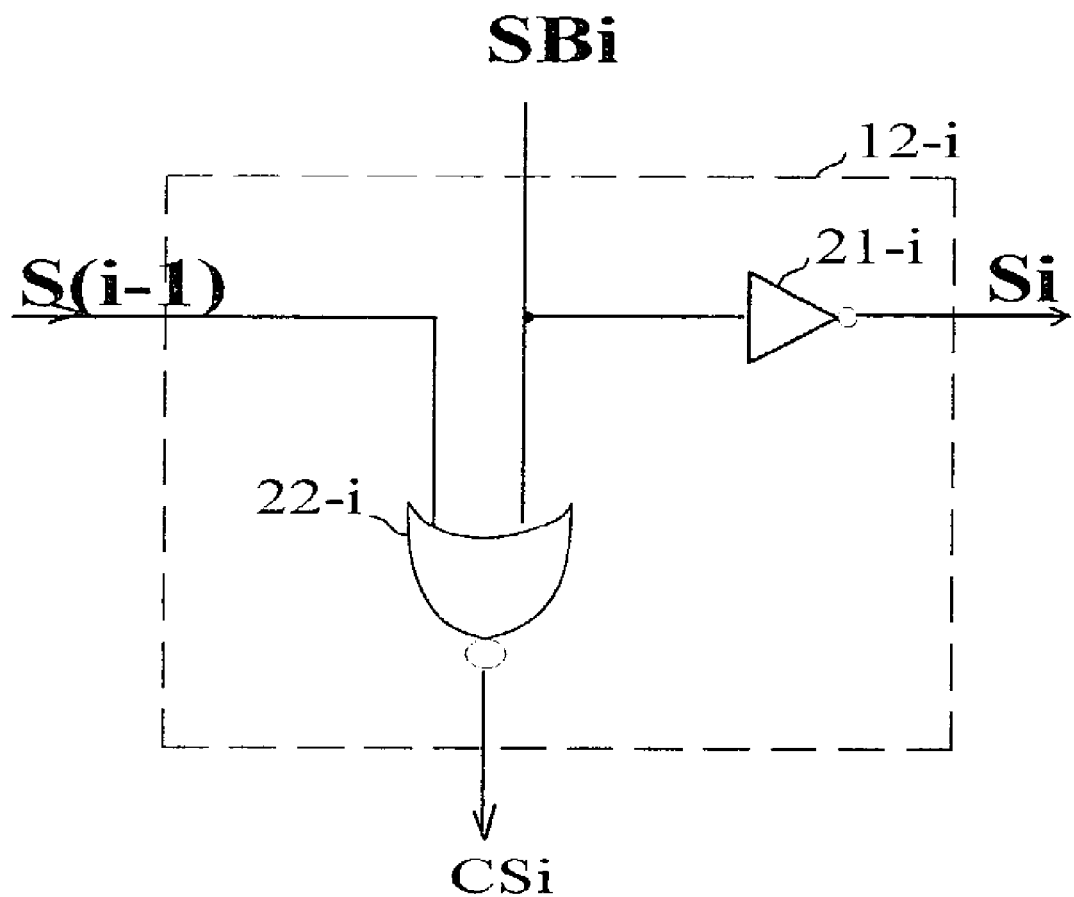
FIG. 4 illustrates a second embodiment of a selection unit.
Figure 5:
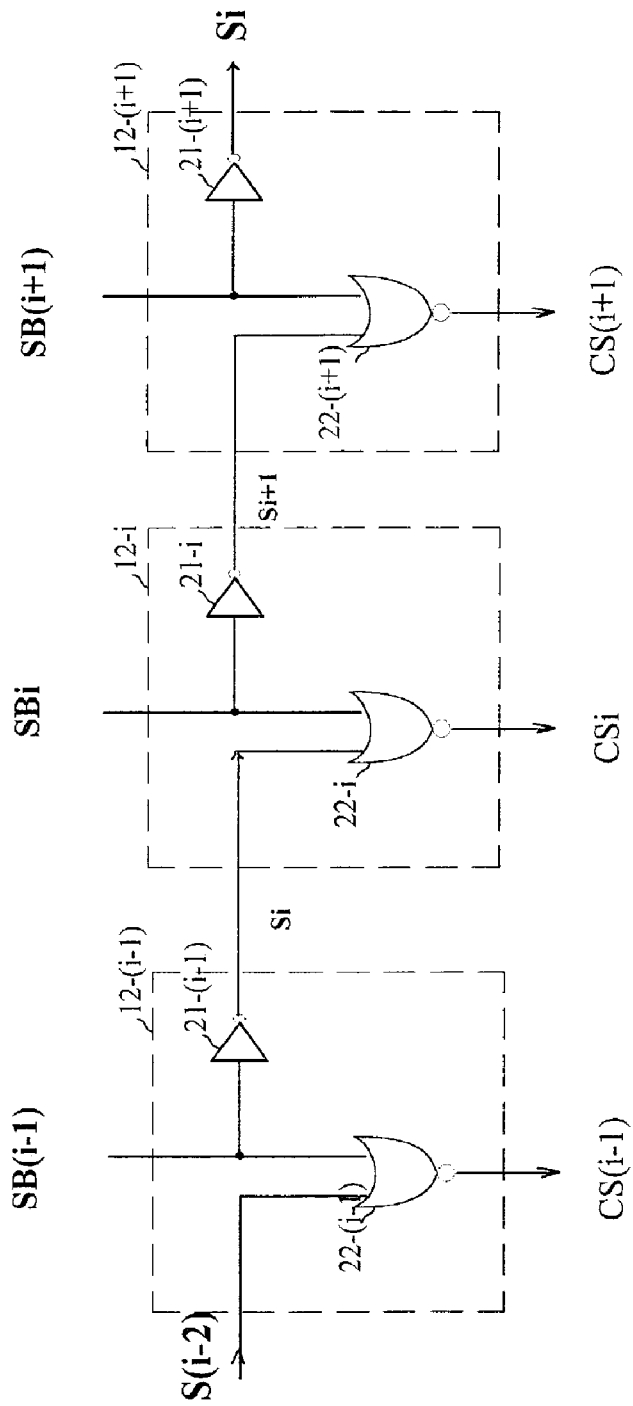
FIG. 5 illustrates the chaining of the selection units of FIG. 4.

FIG. 4 describes a second embodiment of a rank i logical selection unit for association with each memory unit. In this second embodiment, the second chain of information $SN_i$ is omitted, which allows a simpler realization. Each logical unit $12_i$ of this embodiment includes a NOR gate $22_i$ having a first input receiving the signal $S_{i-1}$ generated by the preceding unit, and a second input receiving the status bit $SB_i$ of the corresponding memory unit. In addition, this status bit $SB_i$ is transmitted to an input of an inverter $21_i$ to generate information $S_i$ that is transmitted to the selection unit immediately on the right, as shown by the chain of FIG. 5. The first selection unit $12_0$ receives a logical signal set to 0 so that the output of the NOR gate is in a high logical state. Thus, selection circuit $CS_0$ is activated, which allows use of the first page in the memory unit. Upon storing of status bit $CS_1$, the control logic is switched and then the next NOR gate switches, thus allowing activation of the next page.

Thus, it is noted that one single page is exclusively selected, which page is defined by a $CS_i$ equal to 1, and all other pages are deselected.

Among possible applications, it is observed that the technique of the present invention allows realization of FLASH-type memory circuits based simply on a fuse/non-fuse technology of the EPROM type. In particular, the thin oxide capacity of CMOS technology, or any other technology of the EPROM type based on dual state circuits, could advantageously be used. Further, the present invention can be realized in hardware or a combination of hardware and software. Any processor, controller, or other apparatus adapted for carrying out the functionality described herein is suitable. A typical combination of hardware and software could include a general purpose processor (or a controller) with a computer program that, when loaded and executed, carries out the functionality described herein.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A few times programmable storage element comprising:
    a set of N elementary memory units, each of the elementary memory units including an address bus for connection to a main address bus and a data bus for connection to a main data bus;
    means for generating successive selection signals for successively selecting one of the elementary memory units in order to give exclusive access to the one selected elementary memory unit,
    wherein the means for generating successive selection signals automatically selects a next one of the elementary memory units upon detection of a condition, and
    each of the elementary memory units is a One-Time-Programmable memory unit.

2. The few times programmable storage element according to claim 1, wherein each of the elementary memory units comprises a PROM or EPROM memory unit.

3. The few times programmable storage element according to claim 2,
    wherein each elementary memory unit includes a status bit for storing end of selection of the elementary memory unit information, and
    the condition corresponds to writing of the status bit of the elementary memory unit.

4. The few times programmable storage element according to claim 3, wherein the means for generating successive selection signals comprises a set of n selection units, each of the selection units being associated with a corresponding one of the elementary memory units and generating a control signal for activating the corresponding elementary memory unit.

5. The few times programmable storage element according to claim 4, wherein the n selection units are connected so as to form a chain that generates the selection signal for the rank i elementary memory unit according to the formula:

$$CS_i = (1 \text{ AND } S_1 \text{ AND } \ldots S_{i-1}) \text{ AND } (SN_i \text{ AND } SN_{(i+1)} \ldots \text{ AND } SN_n)$$

for i>2 and <n−1, where $S_i$ is a signal transmitted to the rank i+1 selection unit and $SN_i$ is a signal received from the rank i+1 selection unit.

6. The few times programmable storage element according to claim 5, wherein each rank i selection unit receives information $S_{i-1}$ from the rank i−1 selection unit, and generates information $S_i$ that is transmitted to the rank i+1 selection unit according to the formula:

$$S_i = S_{i-1} \text{ AND } SB_i$$

with the first selection unit generating information $S_1 = SB_1$ that is transmitted to the second selection unit.

7. The few times programmable storage element according to claim 6, wherein each rank i selection unit receives information $SN_i$ from the rank i+1 selection unit, and generates information $SN_{i-1}$ that is transmitted to the rank i−1 selection unit according to the formula:

$$SN_{i-1} = SN_i \text{ AND } SNB_i$$

with $SNB_i$ being the logical reciprocal of $SB_i$ and the last selection unit generating information $SN_{n-1}=SNB_n$ that is transmitted to the penultimate selection unit.

8. The few times programmable storage element according to claim 7, wherein each selection unit includes:
a latch having an input, a clock input, and an output, the clock input receiving an end of programming write cycle signal;
an inverter circuit having an input receiving the status bit corresponding to the rank i elementary memory unit;
a first AND gate having a first input, a second input, and an output, the first input of the first AND gate receiving the status bit corresponding to the rank i elementary memory unit, the second input receiving information transmitted by the rank i−1 selection unit, and the output generating information transmitted to the rank i+1 selection unit;
a second AND gate having a first input, a second input, and an output, the first input of the second AND gate being connected to the output of the inverter, the second input receiving the information transmitted from the rank i+1 selection unit, and the output of the second AND gate generating information transmitted to the rank i−1 selection unit; and
a third AND gate having a first input, a second input, and an output, the first input of the third gate receiving information transmitted from lower rank selection unit, the second input being connected to the output of the second AND gate, and the output of the third AND gate generating a control signal transmitted to input D of the latch,
wherein the output of the latch generates the rank i selection signal for selecting the corresponding elementary memory unit.

9. The few times programmable storage element according to claim 1, wherein each of the elementary memory units uses fuses in order to realize a memory unit that is One-Time-Programmable.

10. The few times programmable storage element according to claim 9,
wherein each of the elementary memory units is formed using a CMOS technology, and
each of the fuses is formed by utilizing a thin oxide capacity of the CMOS technology.

11. A few times programmable storage element comprising:
a set of N elementary memory units, each of the elementary memory units including an address bus for connection to a main address bus and a data bus for connection to a main data bus;
a plurality of selection circuits generating successive selection signals for successively selecting one of the elementary memory units in order to give exclusive access to the one selected elementary memory unit,
wherein the selection circuits automatically select a next one of the elementary memory units upon detection of a condition, and
each of the elementary memory units is a One-Time-Programmable memory unit.

12. The few times programmable storage element according to claim 11, wherein each of the elementary memory units comprises a PROM or EPROM memory unit.

13. The few times programmable storage element according to claim 12,
wherein each elementary memory unit includes a status bit for storing end of selection of the elementary memory unit information, and
the condition corresponds to writing of the status bit of the elementary memory unit.

14. The few times programmable storage element according to claim 11, wherein each of the elementary memory units uses fuses in order to realize a memory unit that is One-Time-Programmable.

15. The few times programmable storage element according to claim 14, wherein each of the fuses is formed by utilizing a thin oxide capacity of a CMOS technology.

16. An information processing system including at least one few times programmable (FTP) storage element, said FTP storage element comprising:
a set of N elementary memory units, each of the elementary memory units including an address bus for connection to a main address bus and a data bus for connection to a main data bus;
means for generating successive selection signals for successively selecting one of the elementary memory units in order to give exclusive access to the one selected elementary memory unit,
wherein the means for generating successive selection signals automatically selects a next one of the elementary memory units upon detection of a condition, and
each of the elementary memory units is a One-Time-Programmable memory unit.

17. The information processing system according to claim 16, wherein each of the elementary memory units of the FTP storage element comprises a PROM or EPROM memory unit.

18. The information processing system according to claim 17,
wherein each elementary memory unit of the FTP storage element includes a status bit for storing end of selection of the elementary memory unit information, and
the condition corresponds to writing of the status bit of the elementary memory unit.

19. The information processing system according to claim 18, wherein the means for generating successive selection signals of the FTP storage element comprises a set of n selection units, each of the selection units being associated with a corresponding one of the elementary memory units and generating a control signal for activating the corresponding elementary memory unit.

20. The information processing system according to claim 19, wherein the n selection units of the FTP storage element are connected so as to form a chain that generates the selection signal for the rank i elementary memory unit according to the formula:

$$CS_i = (1 \text{ AND } S_1 \text{ AND } \ldots S_{i-1}) \text{ AND } (SN_i \text{ AND } SN_{(i+1)} \ldots \text{ AND } SN_n)$$

for i>2 and <n−1, where $S_i$ is a signal transmitted to the rank i+1 selection unit and $SN_i$ is a signal received from the rank i+1 selection unit.

21. The information processing system according to claim 20, wherein each selection unit of the FTP storage element includes:
a latch having an input, a clock input, and an output, the clock input receiving an end of programming write cycle signal;

an inverter circuit having an input receiving the status bit corresponding to the rank i elementary memory unit;

a first AND gate having a first input, a second input, and an output, the first input of the first AND gate receiving the status bit corresponding to the rank i elementary memory unit, the second input receiving information transmitted by the rank i−1 selection unit, and the output generating information transmitted to the rank i+1 selection unit;

a second AND gate having a first input, a second input, and an output, the first input of the second AND gate being connected to the output of the inverter, the second input receiving the information transmitted from the rank i+1 selection unit, and the output of the second AND gate generating information transmitted to the rank i−1 selection unit; and a third AND gate having a first input, a second input, and an output, the first input of the third gate receiving information transmitted from lower rank selection unit, the second input being connected to the output of the second AND gate, and the output of the third AND gate generating a control signal transmitted to input D of the latch, wherein the output of the latch generates the rank i selection signal for selecting the corresponding elementary memory unit.

22. The information processing system according to claim 16, wherein each of the elementary memory units of the FTP storage element uses fuses in order to realize a memory unit that is One-Time-Programmable.

\* \* \* \* \*